United States Patent
Yoo et al.

(10) Patent No.: US 10,050,609 B2
(45) Date of Patent: Aug. 14, 2018

(54) ANTENNA SWITCH CIRCUIT WITH IMPROVED HARMONIC SUPPRESSION CHARACTERISTIC

(71) Applicant: Samsung Electro-Mechanics Co., Ltd., Suwon-si (KR)

(72) Inventors: Hyun Jin Yoo, Suwon-si (KR); Yoo Hwan Kim, Suwon-si (KR); Yoo Sam Na, Suwon-si (KR); Jong Mo Lim, Suwon-si (KR); Hyun Hwan Yoo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/691,167

(22) Filed: Aug. 30, 2017

(65) Prior Publication Data

US 2018/0097511 A1    Apr. 5, 2018

(30) Foreign Application Priority Data

Oct. 5, 2016  (KR) .................. 10-2016-0128179
Dec. 5, 2016  (KR) .................. 10-2016-0164427

(51) Int. Cl.
*H03K 17/687* (2006.01)
*H03K 17/16* (2006.01)
(Continued)

(52) U.S. Cl.
CPC .............. *H03K 5/1252* (2013.01); *H01Q 1/50* (2013.01); *H03H 11/04* (2013.01)

(58) Field of Classification Search
CPC ....... H03K 15/1252; H03H 11/04; H01Q 1/50
See application file for complete search history.

(56) References Cited

U.S. PATENT DOCUMENTS 9,190,994 B2    11/2015  Hurwitz
9,438,223 B2 *   9/2016  de Jongh ............. H03K 17/161
(Continued)

FOREIGN PATENT DOCUMENTS

JP    2012-15608 A      1/2012
KR    10-0638879 B1    10/2006
(Continued)

OTHER PUBLICATIONS

Korean Office Action dated Jan. 25, 2018 in corresponding Korean Patent Application No. 10-2016-0164427 (9 pages in English, 6 pages in Korean).

*Primary Examiner* — Kenneth B Wells
(74) *Attorney, Agent, or Firm* — NSIP Law

(57) ABSTRACT

An antenna switch circuit includes: a first switch circuit connected between a first signal port for signal transmission and reception and an antenna port, and operated by a first gate signal; and a second switch circuit connected between a second signal port for signal transmission and reception and the antenna port, and operated by a second gate signal. The first switch circuit and/or the second switch circuit includes a first transistor and a second transistor connected in series between the first and second signal ports, a first voltage dividing circuit including a first resistor and a second resistor connected in series between a source and a drain of the first transistor, and a first variable capacitor circuit connected between the first voltage dividing circuit and a body of the first transistor, and having capacitance varying according to a voltage across opposite ends of the first variable capacitor circuit.

18 Claims, 16 Drawing Sheets

(51) Int. Cl.
  *H03K 5/1252* (2006.01)
  *H01Q 1/50* (2006.01)
  *H03H 11/04* (2006.01)

(56) References Cited

U.S. PATENT DOCUMENTS

| | | |
|---|---|---|
| 9,876,496 B2 * | 1/2018 | Yoo ................. H03K 17/693 |
| 2007/0123175 A1 | 5/2007 | Watanabe et al. |
| 2011/0316062 A1 | 12/2011 | Kondo et al. |
| 2015/0341026 A1 | 11/2015 | de Jongh |
| 2016/0285449 A1 | 9/2016 | Yoo et al. |

FOREIGN PATENT DOCUMENTS

| | | |
|---|---|---|
| KR | 10-0845491 B1 | 7/2008 |
| KR | 10-2016-0115002 A | 10/2016 |

\* cited by examiner

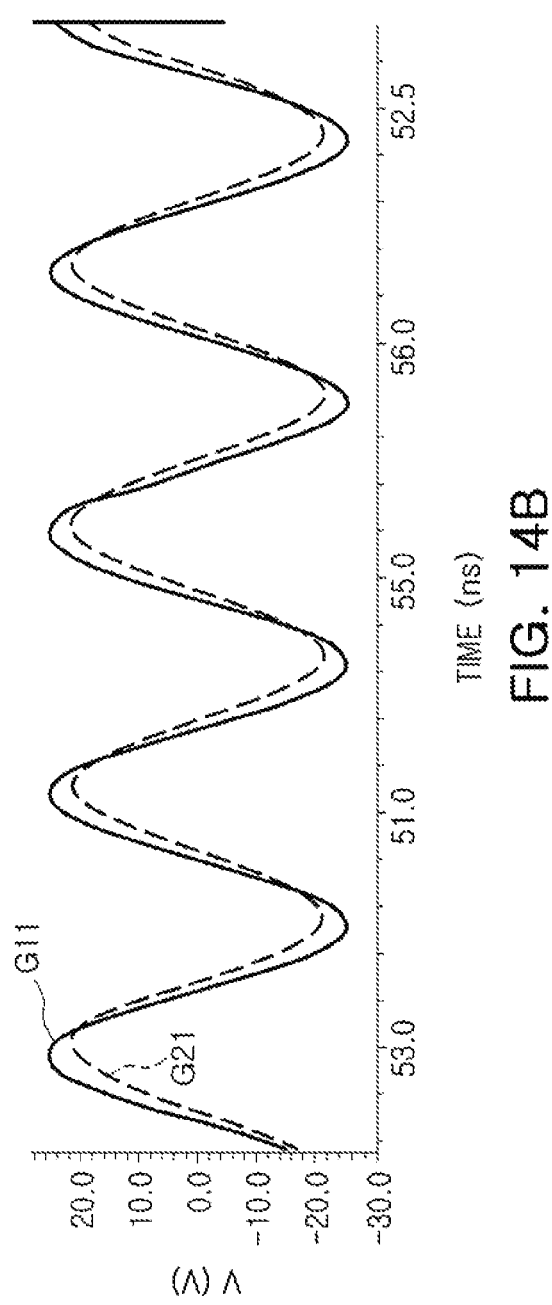

ANTENNA SWITCH CIRCUIT WITH IMPROVED HARMONIC SUPPRESSION CHARACTERISTIC

CROSS-REFERENCE TO RELATED APPLICATIONS

This application claims the benefit of Korean Patent Application Nos. 10-2016-0128179 and 10-2016-0164427, filed on Oct. 5, 2016 and Dec. 5, 2016, respectively, in the Korean Intellectual Property Office, the entire disclosures of which are incorporated herein by reference for all purposes.

BACKGROUND

1. Field

The following description relates to an antenna switch circuit that improves harmonic suppression characteristics using body control.

2. Description of Related Art

In general, as carrier aggregation (CA) is widely deployed in wireless communications systems, improvements are being made in the harmonic attenuation performance of duplexers used in the wireless communications systems. In particular the attenuation characteristics of a 2nd or 3rd harmonic in 5, 8, 12, 13, 20, 26 and 28 bands, used in a low band of 600 MHz to 1000 MHz, are regarded as important.

One method of providing harmonic attenuation characteristics in an antenna switch module (ASM) of the related art is to add a harmonic suppression function to a duplexer connected to the rear end of an antenna switch circuit. In this case, since the isolation performance of the duplexer requires high performance specifications, it may be difficult to achieve desired harmonic attenuation performance while meeting the requirements for the isolation performance.

Furthermore, a band stop resonant circuit can be added to a duplexer transmit (Tx) matching path to improve harmonic attenuation in a duplexer. In this case, a parallel connection resonant circuit or a series connection shunt resonant circuit can be used as the resonant circuit. Each of these resonant circuits includes an inductor and a capacitor, so that two or more resonant circuits are necessary. Therefore, additional space is required and manufacturing costs are increased.

Another method of providing harmonic attenuation characteristics in the ASM of the related art is to add a circuit having a harmonic attenuation function, such as a low pass filter, to the front end of the ASM. In this case, since a band in which the harmonic attenuation function is not necessary is attenuated, a degradation such as insertion loss may occur.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, an antenna switch circuit includes: a first switch circuit connected between a first signal port for signal transmission and reception and an antenna port, and configured to be operated by a first gate signal; and a second switch circuit connected between a second signal port for signal transmission and reception and the antenna port, and configured to be operated by a second gate signal. Either one or both of the first switch circuit and the second switch circuit includes a first transistor and a second transistor connected in series between the first and second signal ports, a first voltage dividing circuit including a first resistor and a second resistor connected in series between a source of the first transistor and a drain of the first transistor, and a first variable capacitor circuit connected between the first voltage dividing circuit and a body of the first transistor, and having capacitance varying according to a voltage across opposite ends of the first variable capacitor circuit.

The either one or both of the first switch circuit and the second switch circuit may further include a second voltage dividing circuit including a third resistor and a fourth resistor connected in series between a source of the second transistor and a drain of the second transistor, and a second variable capacitor circuit connected between the second voltage dividing circuit and a body of the second transistor, and having capacitance varying according to a voltage across opposite ends of the second variable capacitor circuit.

The first variable capacitor circuit may include a first variable capacitor connected between a first connection node, located between the first resistor and the second resistor, and a body node of the first transistor. The first variable capacitor may have capacitance varying according to a magnitude of a voltage between the first connection node and the body node of the first transistor.

The first variable capacitor may include a varactor diode.

The first variable capacitor circuit may include a first variable capacitor connected between a first connection node, located between the first resistor and the second resistor, and a body node of the first transistor, and a second variable capacitor connected between an end of the second resistor, opposite the first connection node, and the body node of the first transistor. The first variable capacitor may have capacitance varying according to a magnitude of a voltage between the first connection node and the body node of the first transistor. The second variable capacitor may have capacitance varying according to a magnitude of a voltage between the end of the second resistor and the body node of the first transistor.

The second variable capacitor circuit may include a first variable capacitor connected between a third connection node, located between the third resistor and the fourth resistor, and a body node of the second transistor. The first variable capacitor may have capacitance varying according to a magnitude of a voltage between the third connection node and the body node of the second transistor.

The second variable capacitor circuit may include a first variable capacitor connected between a third connection node, located between the third resistor and the fourth resistor, and a body node of the second transistor, and a second variable capacitor connected between an end of the fourth resistor, opposite the third connection node, and the body node of the second transistor. The first variable capacitor may have capacitance varying according to a magnitude of a voltage between the third connection node and the body node of the second transistor. The second variable capacitor may have capacitance varying according to a magnitude of a voltage between the end of the fourth resistor and the body node of the second transistor.

The second resistor may be connected to a connection node of the first and second transistors, and may have a resistance value that is less than a resistance value of the first resistor. The third resistor may be connected to the connection node of the first and second transistors, and may have a resistance value that is less than a resistance value of the fourth resistor.

The second resistor may be connected to a connection node of the first and second transistors, and may have a resistance value that is greater than a resistance value of the first resistor. The third resistor may be connected to the connection node of the first and second transistors, and may have a resistance value that is greater than a resistance value of the fourth resistor.

In another general aspect, an antenna switch circuit includes: a first switch circuit connected between a first signal port for signal transmission and reception and an antenna port, and configured to be operated by a first gate signal; a second switch circuit connected between a second signal port for signal transmission and reception and the antenna port, and configured to be operated by a second gate signal; a first shunt circuit connected in series between the first signal port and a first ground port, and configured to be switched by a third gate signal together with the first switch circuit; and a second shunt circuit connected in series between the second signal port and a second ground port, and configured to be switched by a fourth gate signal together with the second switch circuit. Any one or any combination of any two or more of the first switch circuit, the second switch circuit, the first shunt circuit, and the second shunt circuit includes a first transistor and a second transistor connected in series between the first and second signal ports, a first voltage dividing circuit including a first resistor and a second resistor connected in series between a source of the first transistor and a drain of the first transistor, and a first variable capacitor circuit connected between the first voltage dividing circuit and a body of the first transistor, and having capacitance varying according to a voltage across opposite ends of the first variable capacitor circuit.

The any one or any combination of any two or more of the first switch circuit, the second switch circuit, the first shunt circuit, and the second shunt circuit may include a second voltage dividing circuit including a third resistor and a fourth resistor connected in series between a source of the second transistor and a drain of the second transistor, and a second variable capacitor circuit connected between the second voltage dividing circuit and a body of the second transistor, and having capacitance varying according to a voltage across opposite ends of the second variable capacitor circuit.

The first variable capacitor circuit may include a first variable capacitor connected between a first connection node, located between the first resistor and the second resistor, and a body node of the first transistor. The first variable capacitor may have capacitance varying according to a magnitude of a voltage between the first connection node and the body node of the first transistor.

The first variable capacitor may include a varactor diode.

The first variable capacitor circuit may include a first variable capacitor connected between a first connection node, located between the first resistor and the second resistor, and a body node of the first transistor, and a second variable capacitor connected between an end of the second resistor, opposite the first connection node, and the body node of the first transistor. The first variable capacitor may have capacitance varying according to a magnitude of a voltage between the first connection node and the body node of the first transistor. The second variable capacitor may have capacitance varying according to a magnitude of a voltage between the end of the second resistor and the body node of the first transistor.

The second variable capacitor circuit may include a first variable capacitor connected between a third connection node, located between the third resistor and the fourth resistor, and a body node of the second transistor. The first variable capacitor may have capacitance varying according to a magnitude of a voltage between the third connection node and the body node of the second transistor.

The second variable capacitor circuit may include a first variable capacitor connected between a third connection node, located between the third resistor and the fourth resistor, and a body node of the second transistor, and a second variable capacitor connected between an end of the fourth resistor, opposite the third connection node, and the body node of the second transistor. The first variable capacitor may have capacitance varying according to a magnitude of a voltage between the third connection node and the body node of the second transistor. The second variable capacitor may have capacitance varying according to a magnitude of a voltage between the end of the fourth resistor and the body node of the second transistor.

The second resistor may be connected to a connection node of the first and second transistors, and may have a resistance value that is less than a resistance value of the first resistor. The third resistor may be connected to the connection node of the first and second transistors, and may have a resistance value that is less than a resistance value of the fourth resistor.

The second resistor may be connected to a connection node of the first and second transistors, and may have a resistance value that is greater than a resistance value of the first resistor. The third resistor may be connected to the connection node of the first and second transistors, and may have a resistance value that is greater than a resistance value of the fourth resistor.

Other features and aspects will be apparent from the following detailed description, the drawings, and the claims.

BRIEF DESCRIPTION OF THE DRAWINGS

FIG. 3 is a circuit diagram of a first switch circuit section, according to an embodiment.

FIG. 4 is a circuit diagram of a first switch circuit, according to another embodiment.

FIG. 14B is a graph of a level of a leakage voltage from a gate of a pass transistor in an on state in the antenna switch circuit, according to an embodiment.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Subsequently, examples are described in further detail with reference to the accompanying drawings.

Figure 1:
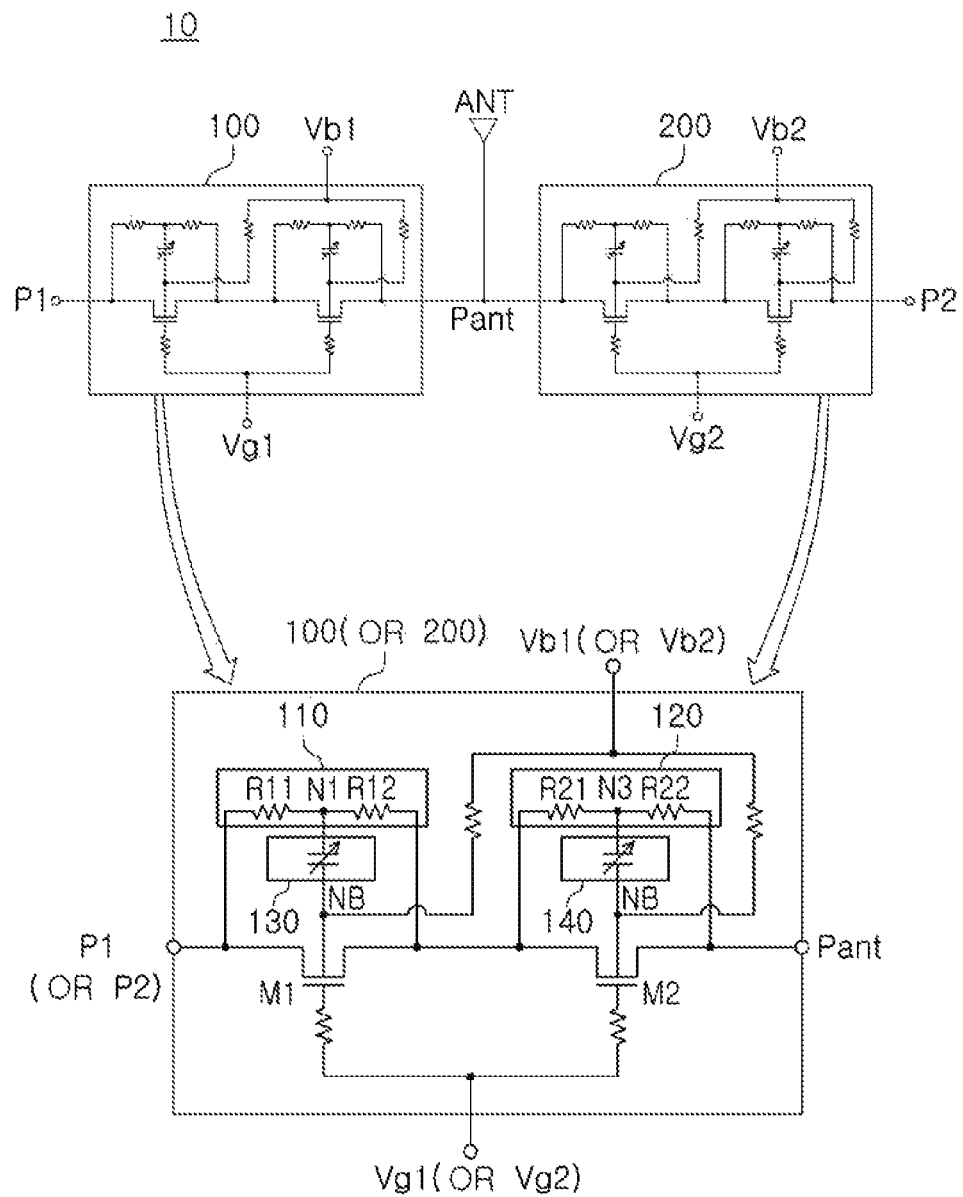
FIG. 1 is a circuit diagram of an antenna switch circuit, according to an embodiment.

FIG. 1 is a circuit diagram of an antenna switch circuit 10, according to an embodiment. Referring to FIG. 1, the antenna switch circuit 10 includes a first switch circuit 100 and a second switch circuit 200.

The first switch circuit 100 is connected between a first signal port P1 for signal transmission and reception, and an antenna port Pant. The first switch circuit 100 is operated by a first gate signal Vg1.

The second switch circuit 200 is connected between a second signal port P2 for signal transmission and reception and the antenna port Pant. The second switch circuit 200 is operated by a second gate signal Vg2.

Either one or both of the first and second switch circuits 100 and 200 includes first and second transistors M1 and M2, a first voltage dividing circuit 110, and a first variable capacitor circuit 130.

In addition, the one or both of the first and second switch circuits 100 and 200 includes a second voltage dividing circuit 120 and a second variable capacitor circuit 140.

The first and second transistors M1 and M2 are connected in series between the first and second signal ports P1 and P2.

For example, when the first and second transistors M1 and M2 are included in the first switch circuit 100, the first and second transistors M1 and M2 are connected in series between the first signal port P1 and the antenna port Pant. In an example, a gate and a body of each of the first and second transistors M1 and M2 are supplied with the first gate signal Vg1 and a first body voltage Vb1 for a switching operation.

For example, when the first and second transistors M1 and M2 are included in the second switch circuit 200, the first and second transistors M1 and M2 are connected in series between the second signal port P2 and the antenna port Pant. In an example, the gate and the body of each of the first and second transistors M1 and M2 are supplied with the second gate signal Vg2 and a second body voltage Vb2 for a switching operation.

The first voltage dividing circuit 110 includes a first resistor R11 and a second resistor R12, which are connected in series between a source and a drain of the first transistor M1.

The first variable capacitor circuit 130 is connected between the first voltage dividing circuit 110 and the body of the first transistor M1, and has capacitance varying according to a voltage across opposite ends of the first variable capacitor circuit 130.

The second voltage dividing circuit 120 includes a third resistor R21 and a fourth resistor R22, which are connected in series between a source and a drain of the second transistor M2.

The second variable capacitor circuit 140 is connected between the second voltage dividing circuit 120 and the body of the second transistor M2, and has capacitance varying according to a voltage across opposite ends of the second variable capacitor circuit 140.

Figure 2:
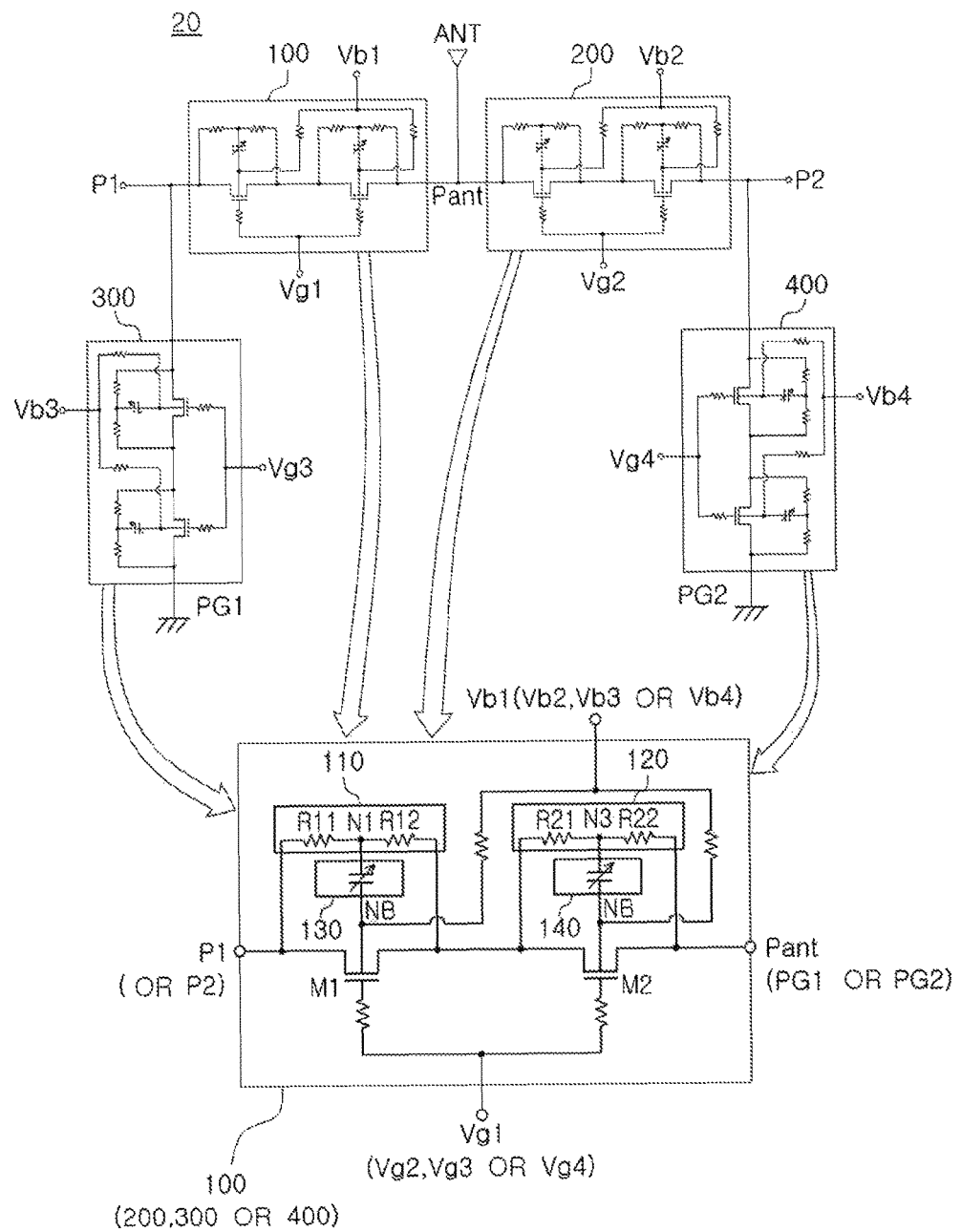
FIG. 2 is a circuit diagram of an antenna switch circuit, according to another embodiment.

FIG. 2 is a circuit diagram of another example of an antenna switch circuit 20 according to an example.

Referring to FIG. 2, the antenna switch circuit 20 includes a first switch circuit 100, a second switch circuit 200, a first shunt circuit 300, and a second shunt circuit 400.

The first switch circuit 100 is connected between a first signal port P1 for signal transmission and reception and an antenna port Pant. The first switch circuit 100 is operated by a first gate signal Vg1.

The second switch circuit 200 is connected between a second signal port P2 for signal transmission and reception and the antenna port Pant. The second switch circuit 200 is operated by a second gate signal Vg2.

The first shunt circuit 300 is connected between the first signal port P1 and a first ground port PG1 and is switched by a third gate signal Vg3 in complementary relationship (e.g., together) with the first switch circuit 100.

The second shunt circuit 400 is connected between the second signal port P2 and a second ground port PG2 and is switched by a fourth gate signal Vg4 in complementary relation (e.g., together) with the second switch circuit 200.

Any one or any combination of any two or more of the first switch circuit 100, the second switch circuit 200, the first shunt circuit 300, and the second shunt circuit 400 includes the first and second transistors M1 and M2, the first voltage dividing circuit 110, and the first variable capacitor circuit 130.

In addition, the one or the combination of any two or more of the first switch circuit 100, the second switch circuit 200, the first shunt circuit 300, and the second shunt circuit 400 includes the second voltage dividing circuit 120 and the second variable capacitor circuit 140.

The first and second transistors M1 and M2 are connected in series between the first and second signal ports P1 and P2.

For example, when the first and second transistors M1 and M2 are included in the first switch circuit 100, the first and second transistors M1 and M2 are connected in series between the first signal port P1 and the antenna port Pant. In an example, a gate and a body of each of the first and second transistors M1 and M2 are supplied with the first gate signal Vg1 and a first body voltage Vb1 for a switching operation.

For example, when the first and second transistors M1 and M2 are included in the second switch circuit 200, the first and second transistors M1 and M2 are connected in series between the second signal port P2 and the antenna port Pant. In an example, the gate and the body of each of the first and second transistors M1 and M2 are supplied with the second gate signal Vg2 and a second body voltage Vb2 for a switching operation.

For example, when the first and second transistors M1 and M2 are included in the first shunt circuit 300, the first and second transistors M1 and M2 are connected in series between the first signal port P1 and the first ground port PG1. In an example, the gate and the body of each of the first and second transistors M1 and M2 are supplied with the third gate signal Vg3 and a third body voltage Vb3 for a switching operation.

For example, when the first and second transistors M1 and M2 are included in the second shunt circuit 400, the first and second transistors M1 and M2 are connected in series between the second signal port P2 and the second ground port PG2. In an example, the gate and the body of each of the first and second transistors M1 and M2 are supplied with the fourth gate signal Vg4 and a fourth body voltage Vb4 for a switching operation.

The first voltage dividing circuit 110 includes the first resistor R11 and the second resistor R12, which are connected in series between a source and a drain of the first transistor M1.

The first variable capacitor circuit 130 is connected between the first voltage dividing circuit 110 and the body of the first transistor M1 and has capacitance varying according to a voltage across opposite ends of the first variable capacitor circuit 130.

The second voltage dividing circuit 120 includes the third resistor R21 and the fourth resistor R22 connected in series between a source and a drain of the second transistor M2.

The second variable capacitor circuit 140 is connected between the second voltage dividing circuit 120 and the body of the second transistor M2, and has capacitance varying according to a voltage across opposite ends of the second variable capacitor circuit 140.

Hereinafter, redundant descriptions with reference to FIGS. 1 through 4 will be omitted, and thus descriptions of the same reference numerals may also be omitted. In addition, since the first switch circuit 100, the second switch circuit 200, the first shunt circuit 300, and the second shunt circuit 400 are similar in their operating mechanisms, the first switch circuit 100 and a first switch circuit 100A, according to another embodiment, will be described, with the understanding that the description of the first switch circuits 100 and 100A also apply to the second switch circuit 200, the first shunt circuit 300, and the second shunt circuit 400.

Figures 3, 4:
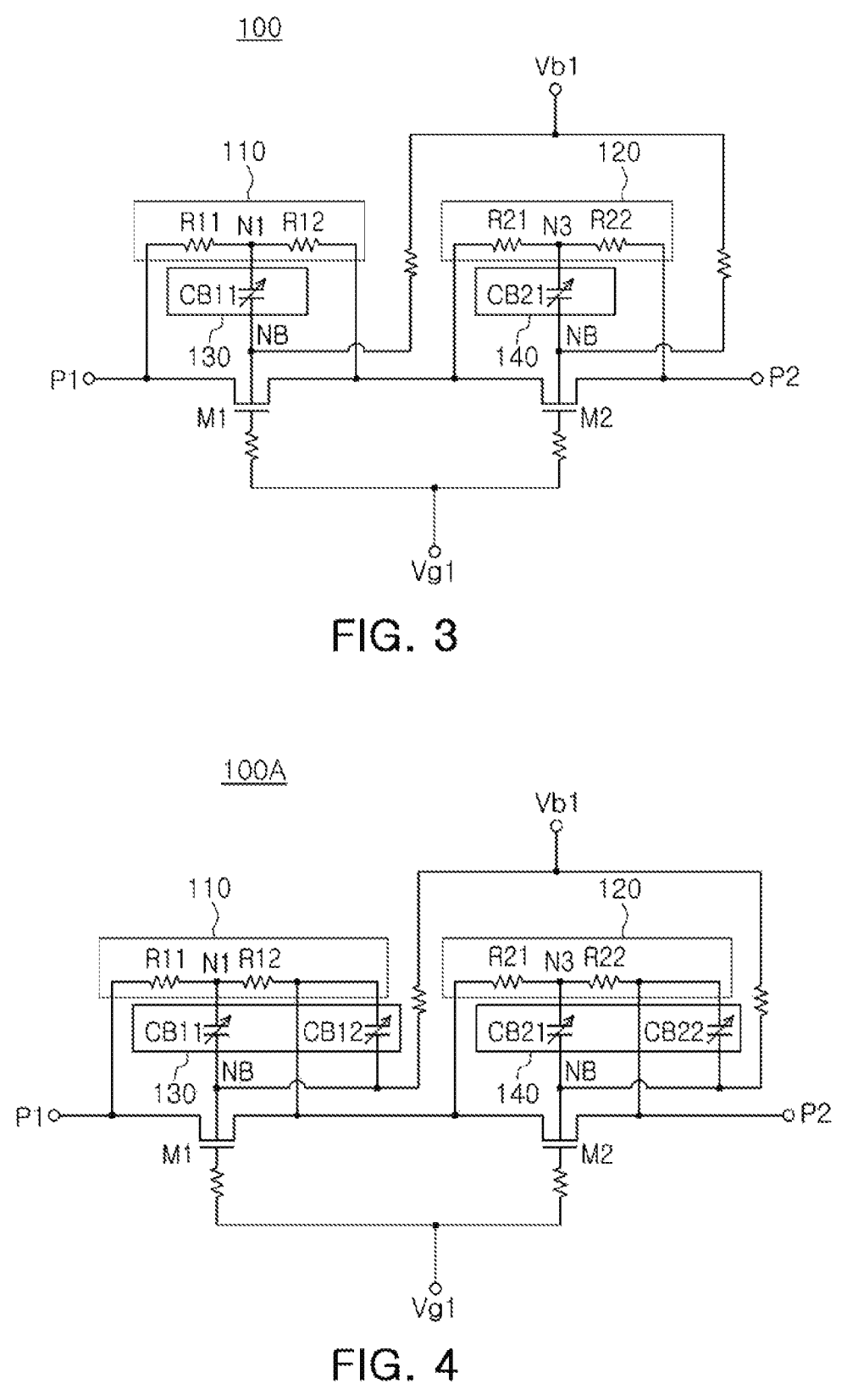

FIG. 3 is a circuit diagram of the first switch circuit 100, according to an embodiment.

Referring to FIG. 3, the first variable capacitor circuit 130 includes a first variable capacitor or capacitor element CB11.

The first variable capacitor element CB11 is connected between the first connection node N1, located between the first resistor R11 and the second resistor R12, and the body node NB of the first transistor M1. In an example, the first variable capacitor element CB11 has capacitance varying according to a magnitude of a voltage between the first connection node N1 and the body node NB.

In addition, the second variable capacitor circuit 140 includes a first variable capacitor or capacitor element CB21.

The first variable capacitor element CB21 is connected between the third connection node N3, located between a third resistor R21 and a fourth resistor R22, and the body node NB of the second transistor M2. In an example, the first variable capacitor element CB21 has capacitance varying according to a magnitude of a voltage between the third connection node N3 and the body node NB of the second transistor M2.

FIG. 4 is a circuit diagram of a first switch circuit 100A, according to another embodiment.

Referring to FIG. 4, a first variable capacitor circuit 130 of the first switch circuit 100A includes a first variable capacitor element CB11 and a second variable capacitor or capacitor element CB12.

The first variable capacitor element CB11 is connected between the first connection node N1, located between the first resistor R11 and the second resistor R12, and the body node NB of the first transistor M1. The second variable capacitor element CB12 is connected between an end of the second resistor R12, opposite the first connection node N1, and the body node NB of the first transistor M1.

In an example, the first variable capacitor element CB11 has capacitance varying according to a magnitude of a voltage between the first connection node N1 and the body node NB of the first transistor M1, and the second variable capacitor element CB12 has capacitance varying according to a magnitude of a voltage between the end of the second resistor R12 and the body node NB of the first transistor M1.

In addition, a second variable capacitor circuit 140 includes the first variable capacitor element CB21 and a second variable capacitor or capacitor element CB22.

The first variable capacitor element CB21 is connected between the third connection node N3, located between the third resistor R21 and the fourth resistor R22, and the body node NB of the second transistor M2. The second variable capacitor element CB22 is connected between an end of the fourth resistor R22, opposite the third connection node N3, and the body node NB of the second transistor M2.

In an example, the first variable capacitor element CB21 has capacitance varying according to a magnitude of a voltage between the third connection node N3 and the body node NB of the second transistor M2, and the second variable capacitor element CB22 has capacitance varying according to a magnitude of a voltage between the end of the fourth resistor R22 and the body node NB of the second transistor M2.

As illustrated in FIGS. 1 through 4, each of the first variable capacitor elements CB11 and CB21 and the second variable capacitor elements CB12 and CB22 may be an element or circuit having capacitance that varies according to a magnitude of a voltage across opposite ends thereof.

For example, the first and second variable capacitor elements CB11, CB21, CB12, and CB22 include a varactor diode, that is, a variable capacitance element. As long as capacitance varies according to a voltage, a well-known variable capacitor element or circuit may also be used.

Figure 5:
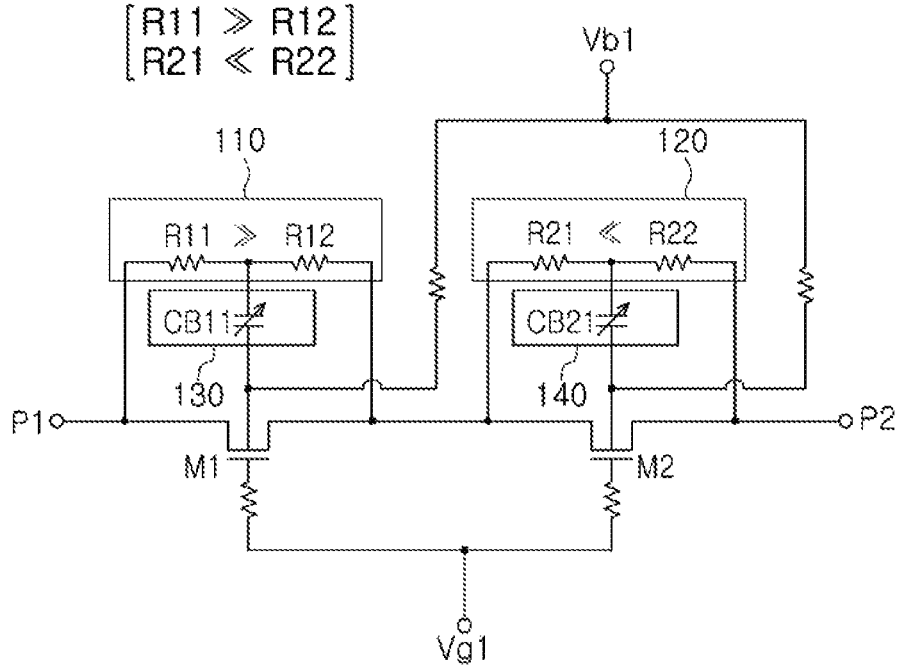
FIG. 5 is a circuit diagram of magnitudes of resistance values of first and second voltage dividing circuits, according to an embodiment.

FIG. 5 is a circuit diagram of magnitudes of resistance values of first and second voltage dividing circuits 110 and 120, according to an embodiment.

Referring to FIG. 5, when the second resistor R12, connected to a connection node of first and second transistors M1 and M2, is set to have a resistance value less than a resistance value of the first resistor R11, the third resistor R21, connected to the connection node of the first and second transistors M1 and M2, is set to have a resistance value less than a resistance value of a fourth resistor R22.

Figure 6:
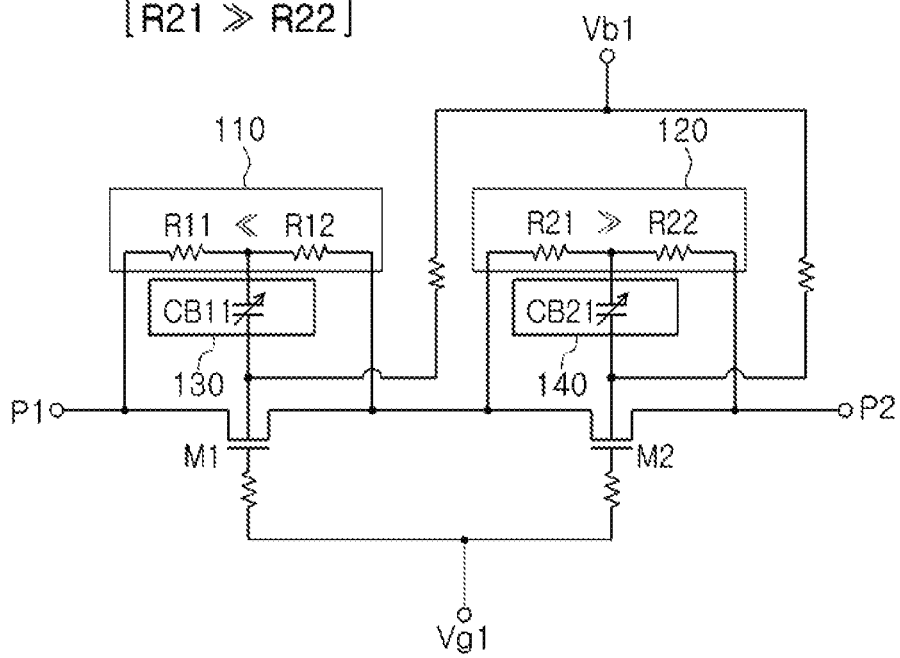
FIG. 6 is a circuit diagram of magnitudes of resistance values of first and second voltage dividing circuits, according to another embodiment.

FIG. 6 is a circuit diagram of magnitudes of resistance values of first and second voltage dividing circuits 110 and 120, according to another embodiment.

Referring to FIG. 6, when the second resistor R12, connected to a connection node of first and second transistors M1 and M2, is set to have a resistance value greater than a resistance value of the first resistor R11, the third resistor R21, connected to the connection node of the first and second transistors M1 and M2, is set to have a resistance value greater than a resistance value of a fourth resistor R22.

Figure 7:
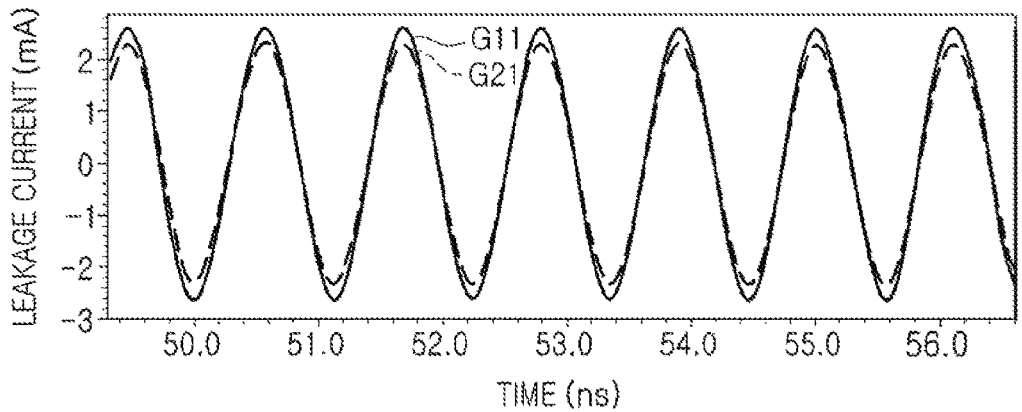
FIG. 7 is a graph of a level of a leakage current from a transistor in an off state of an antenna port of an antenna switch circuit, according to an embodiment.

FIG. 7 is a graph of a level of a leakage current from a transistor in an off state of an antenna port of an antenna switch circuit according to an example.

As illustrated in FIG. 7, G11 indicates a level of a leakage current from a transistor in an off state of an antenna port according to the related art, and G21 indicates a level of the leakage current from the transistor in the off state of the antenna port of the antenna switch circuit 10/20 disclosed herein.

Referring to graphs G11 and G12, illustrated in FIG. 7, the antenna switch circuit 10/20 disclosed herein reduces a level of a leakage current from the transistor of a switch circuit, for example, from a first switch circuit or a second switch circuit, in an off state, viewed from the antenna port Pant.

The antenna switch circuit 10/20 suppresses harmonic components by controlling a body of the transistor without an increase in size and/or stack. For example, the controlling of the body of the transistor suppresses the harmonic components using an RC circuit, the RC circuit including a resistor included in the first voltage dividing circuit having characteristics of a low pass filter and a capacitor of a first variable capacitor circuit.

In addition, the antenna switch circuit reduces a level of a leakage current, from a pass transistor in an off state, as a cut-off cap value of the pass transistor in the off state decreases, thereby increasing harmonic characteristics.

Figure 8:
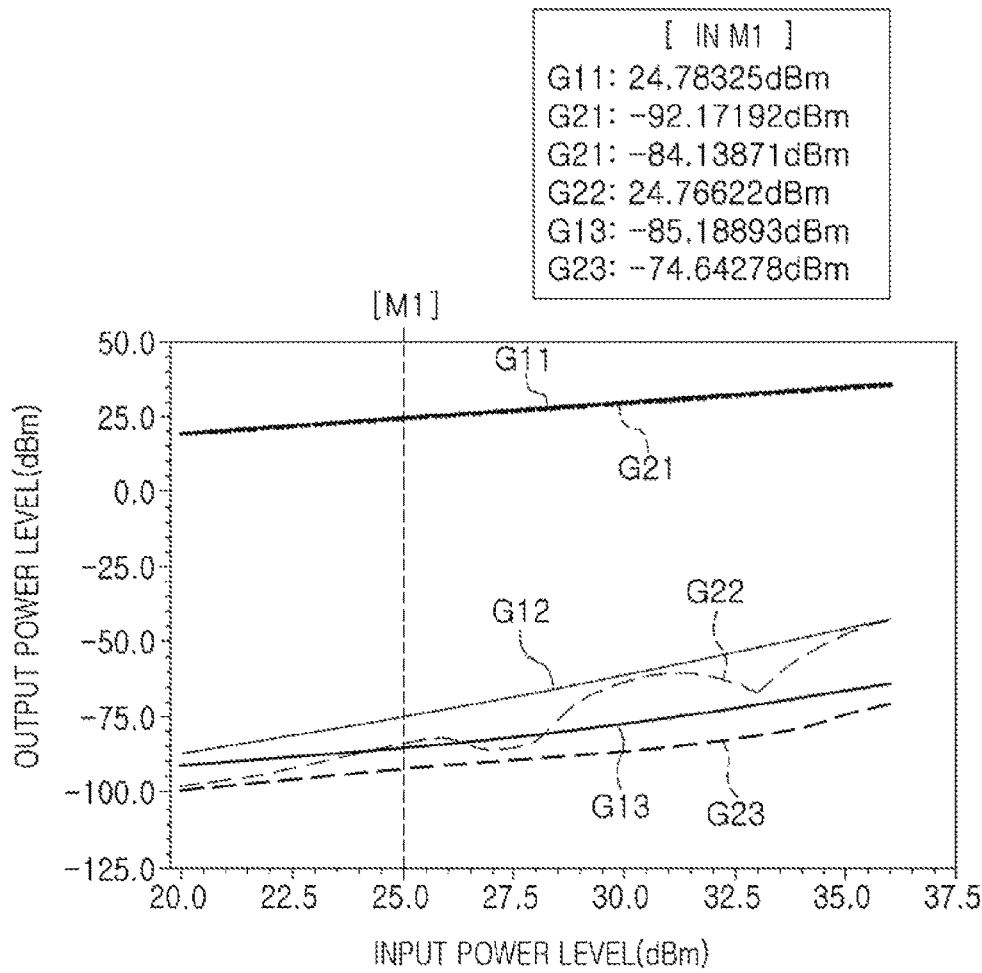
FIG. 8 is a graph illustrating harmonic performance of an antenna switch circuit, (SP4T) according to an embodiment.

FIG. 8 is a graph illustrating harmonic performance of the antenna switch circuit 10/20 (SP4T), according to an embodiment.

Referring to FIG. 8, G11, G12, and G13 indicate a power level (i.e., the horizontal axis represents the input power level (dBm) and the vertical axis represents the output power level (dBm)) of each of fundamental, second, and third harmonics of an input signal according to the related art, and G21, G22, and G23 indicate a power level (i.e., the horizontal axis represents the input power level (dBm) and the vertical axis represents the output power level (dBm)) of each of fundamental, second, and third harmonics of an input signal input to the antenna switch circuit 10/20, according to an embodiment.

Referring to graphs G11 and G21, illustrated in FIG. 8, the power levels of the fundamental harmonics of the input signals are similar. However, referring to G12 and G22, illustrated in FIG. 8, the power level of the second harmonic according to an embodiment disclosed herein is lower than the power level of the second harmonic according to the related art and. With respect to G13 and G23, illustrated in FIG. 8, the power level of the third harmonic according to the embodiment disclosed herein is lower than the power level of the third harmonic according to the related art.

Referring to graphs G11, G12, G13, G21, G22, and G23, illustrated in FIG. 8, in the case of the second harmonic, performance of the antenna switch circuit 10/20 according to the embodiment is increased by about 7 dB or more and, in the case of the third harmonic, the performance of the antenna switch circuit 10/20 according to the example is increased by about 10 dB or more.

Accordingly, according to the example, the antenna switch circuit 10/20 attenuates the leakage current from the transistor in the off state, when viewed from the antenna port Pant, thus obtaining the harmonic characteristics for high performance in the same antenna switch circuit size.

Figure 9A:
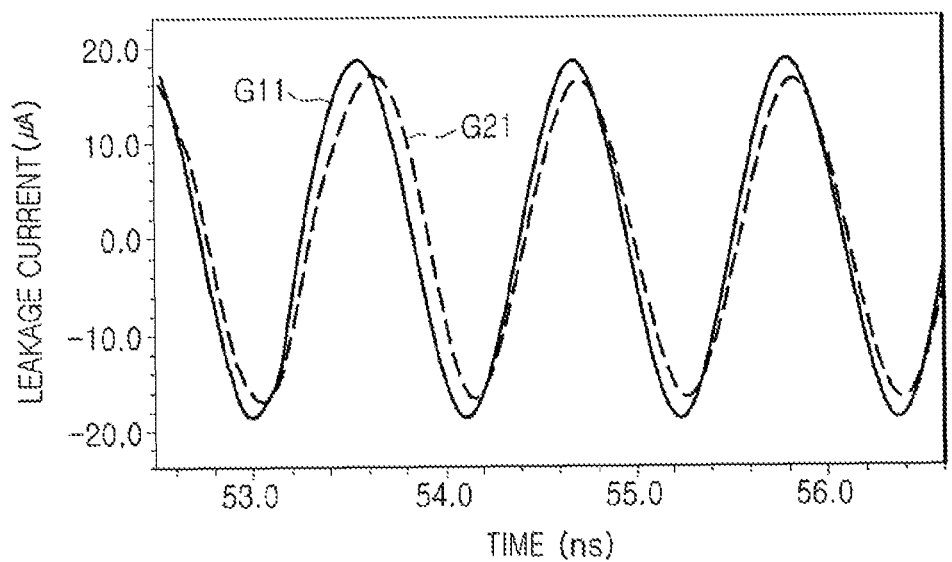
FIG. 9A is a graph of a level of a leakage current from a gate of a pass transistor in an off state, according to an embodiment.
Figure 9B:
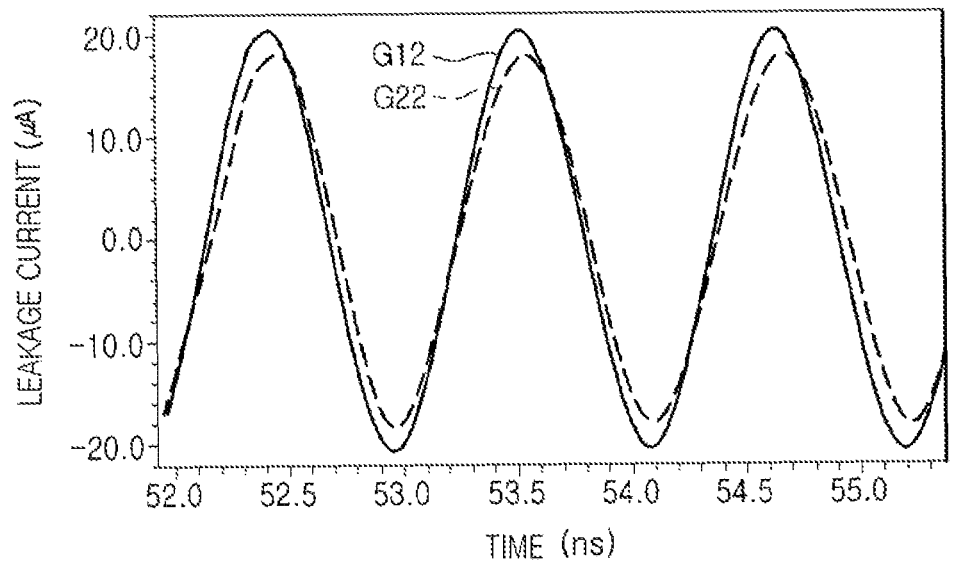
FIG. 9B is a graph of a level of a leakage current from the gate of the pass transistor in an on state, according to an embodiment.

FIG. 9A is a graph of a level of a leakage current from a gate of a pass transistor in an off state. FIG. 9B is a graph of a level of a leakage current from the gate of the pass transistor in an on state.

As illustrated in FIGS. 9A and 9B, G11 and G12 indicate levels of leakage currents from a gate of a pass transistor in off and on states according to the related art, and G21 and G22 indicate levels of leakage currents from the gate of the pass transistor in the off and on states in an antenna switch circuit 10/20, according to an embodiment.

Referring to graphs G11 and G21, illustrated in FIGS. 9A and 9B, the level of the leakage current from the gate of the pass transistor in the off state in the antenna switch circuit 10/20 is lower than the level of the leakage current from the gate of the pass transistor in the off state according to the related art. Referring to graphs G12 and G22, illustrated in FIGS. 9A and 9B, the level of the leakage current from the gate of the pass transistor in the on state in the antenna switch circuit 10/20 according to the disclosed embodiment, is lower than the level of the leakage current from the gate of the pass transistor in the on state according to the related art.

As discussed above, a structure of the antenna switch circuit 10/20, according to the disclosed embodiments, may be applied to an antenna switch circuit having a greater number of throw switches, as well as to the antenna switch circuit 10/20 (SP4T), and may meet tighter harmonic requirements within an IC circuit without the addition of an external element or an increase in the size of a switch IC.

Figure 10:
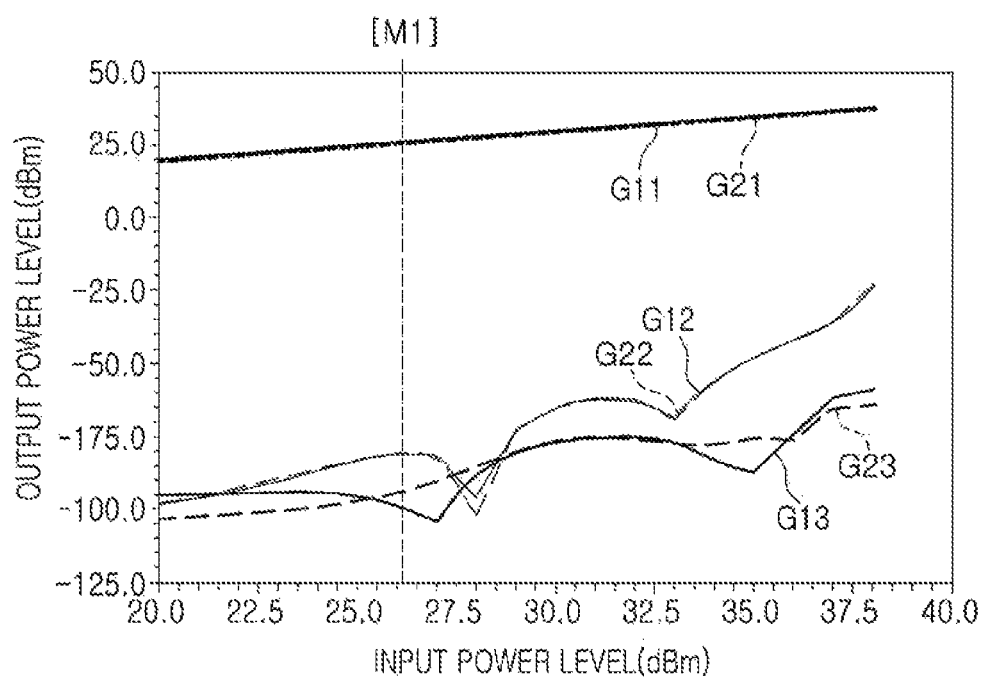
FIG. 10 is a graph illustrating harmonic suppression characteristics according to a voltage deviation of an antenna switch circuit including the first switch circuit of FIG. 4, according to an embodiment.

FIG. 10 is a graph illustrating harmonic suppression characteristics according to a voltage deviation of an antenna switch circuit including the first switch circuit 100A of FIG. 4, according to an embodiment.

Referring to FIG. 10, G11, G12, and G13 indicate a power level (i.e., the horizontal axis represents the input power level (dBm) and the vertical axis represents the output power level (dBm)) of each of fundamental, second, and third harmonics of an input signal according to the related art, and G21, G22, and G23 indicate a power level (i.e., the horizontal axis represents the input power level (dBm) and the vertical axis represents the output power level (dBm)) of each of fundamental, second, and third harmonics of an input signal input to an antenna switch circuit according to an example.

Referring to graphs G11 and G21, illustrated in FIG. 10, the power levels of the fundamental harmonics of the input signals are similar. However, referring to graphs G12 and G22, illustrated in FIG. 10, the power level of the second harmonic, according to the embodiments disclosed herein, is lower than the power level of the second harmonic according to the related art and, referring to graphs G13 and G23, illustrated in FIG. 10, the power level of the third harmonic, according to the embodiments disclosed herein, is lower than the power level of the third harmonic according to the related art.

In particular, referring to graphs G12 and G13 of FIG. 10, the related art has a disadvantage in that there is a point at which the harmonic characteristics change rapidly, at a certain power level. In an example using the first variable capacitor elements CB11 and CB21 and the second variable capacitor elements CB12 and CB22, the spot phenomenon that may occur at the certain power level may be reduced.

Figure 11A:
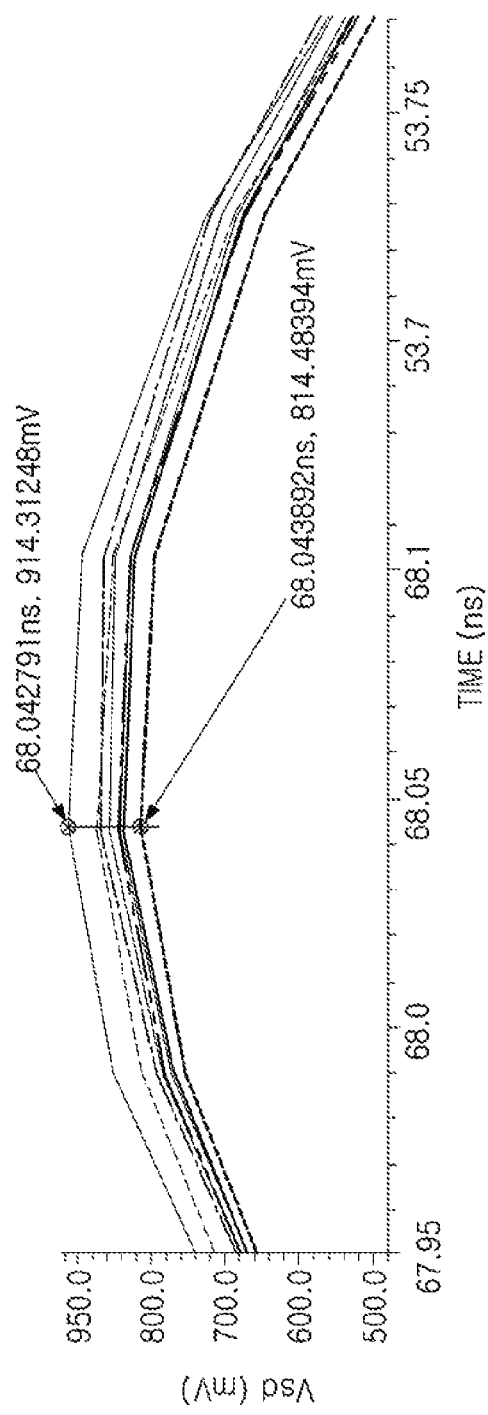
FIGS. 11A and 11B are graphs illustrating voltage deviations related to the harmonic suppression characteristics of an antenna switch circuit including the first switch circuit of FIG. 4, according to an embodiment.
Figure 11B:
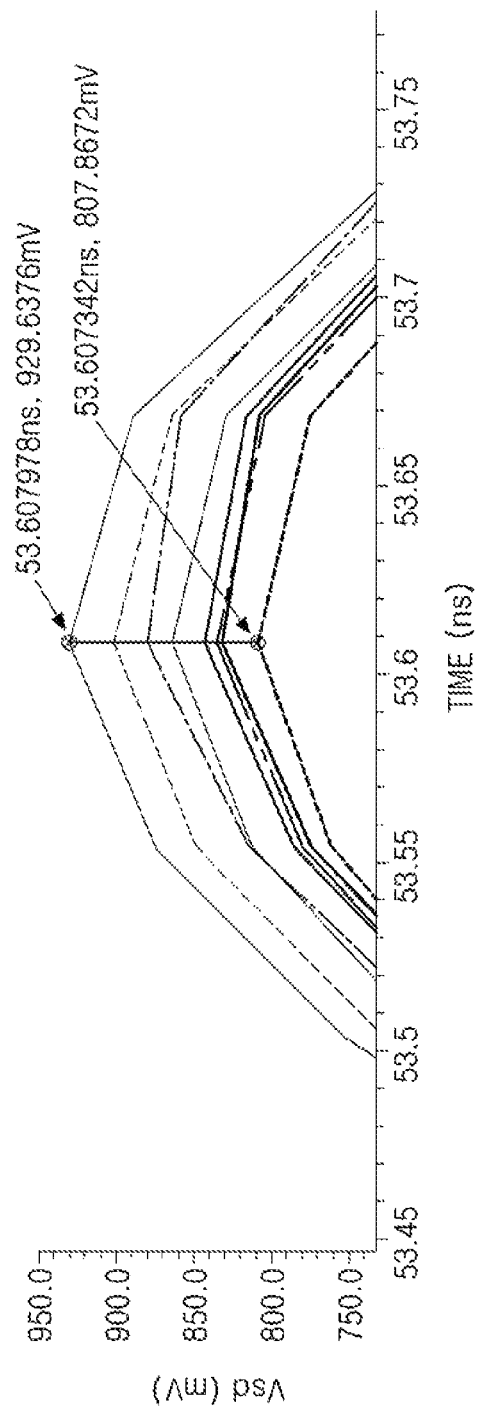

FIGS. 11A and 11B are graphs illustrating voltage deviations related to the harmonic suppression characteristics of an antenna switch circuit including the first switch circuit 100A of FIG. 4, according to an embodiment.

A voltage Vsd deviation of an antenna switch circuit according to an embodiment disclosed herein, illustrated in FIG. 11A, is less than a voltage Vsd deviation of an antenna switch circuit according to the related art, illustrated in FIG. 11B.

That is, as illustrated in FIG. 4, when magnitudes of resistance values among the first resistor R11, the second resistor R12, the third resistor R21, and the fourth resistor R22 (the graph illustrated in FIG. 11A) are set, a source-drain voltage deviation of the transistor is significantly less than a source-drain voltage deviation of the transistor when magnitudes of resistance values among the first resistor, the second resistor, the third resistor, and the fourth resistor are not set (the graph illustrated in FIG. 11B), according to the related art, and thus second harmonic performance may be prevented from deteriorating.

Figure 12:
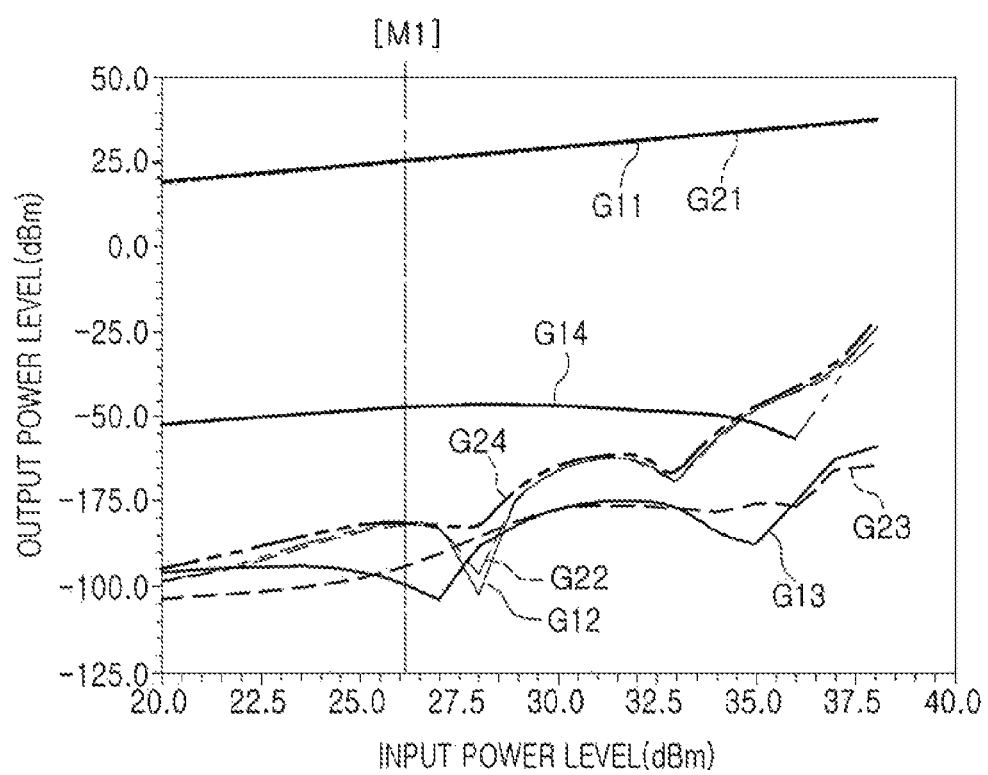
FIG. 12 is a graph of harmonic suppression characteristics when an antenna switch circuit includes first and second variable capacitor elements, according to an embodiment.

FIG. 12 is a graph of harmonic suppression characteristics when an antenna switch circuit includes the first and second variable capacitor elements CB11 and CB12, according to an embodiment.

The graph illustrated in FIG. 12 includes G14 and G24, in addition to the graph of FIG. 10. As illustrated in FIG. 12, G14 indicates a power level the horizontal axis represents the input power level (dBm) and the vertical axis represents the output power level (dBm)) of a second harmonic when magnitudes of resistance values of the first to fourth resistors included in the first and second voltage dividing circuits are not set, and G24 indicates a power level (i.e., the horizontal axis represents the input power level (dBm) and the vertical axis represents the output power level (dBm)) of the second harmonic when magnitudes of resistance values of the first to fourth resistors R11, R12, R21, and R22 included in the first and second voltage dividing circuits 110 and 120 are set (refer to FIGS. 5 and 6).

Referring to graphs G14 and G24 of FIG. 12, as illustrated in FIGS. 5 and 6, when the magnitudes of the resistance values of the first to fourth resistors R11, R12, R21, and R22 included in the first and second voltage dividing circuits are set (refer to G24), the power level of the second harmonic is less than that in the graph G14.

As mentioned above, the antenna switch circuit according to an embodiment disclosed herein reduces the harmonic characteristics by the first and second variable capacitor elements CB11/CB21 and CB12, CB22, and, in particular, improves upon the disadvantage of the related art in which there is a spot at which the harmonic characteristics change rapidly at a certain power level by setting the magnitudes of the resistance values of the first to fourth resistors R11, R12, R21, and R22, included in the first and second voltage dividing circuits 110 and 120, as illustrated in FIGS. 5 and 6.

Figure 13A:
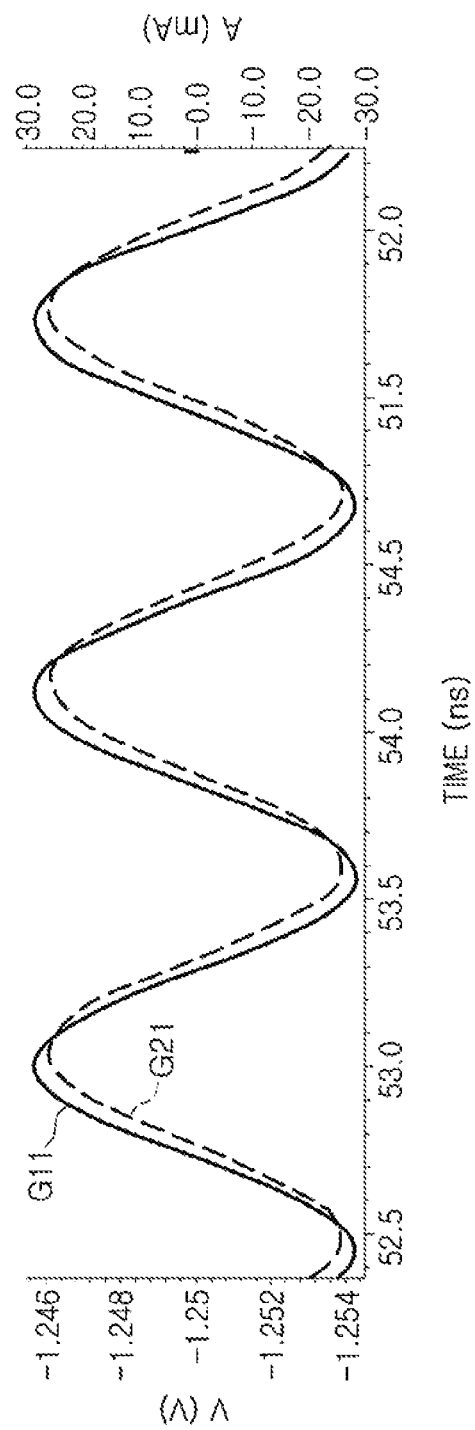
FIG. 13A is a graph of a level of a leakage voltage from a gate of a pass transistor in an off state in an antenna switch circuit, according to an embodiment.
Figure 13B:
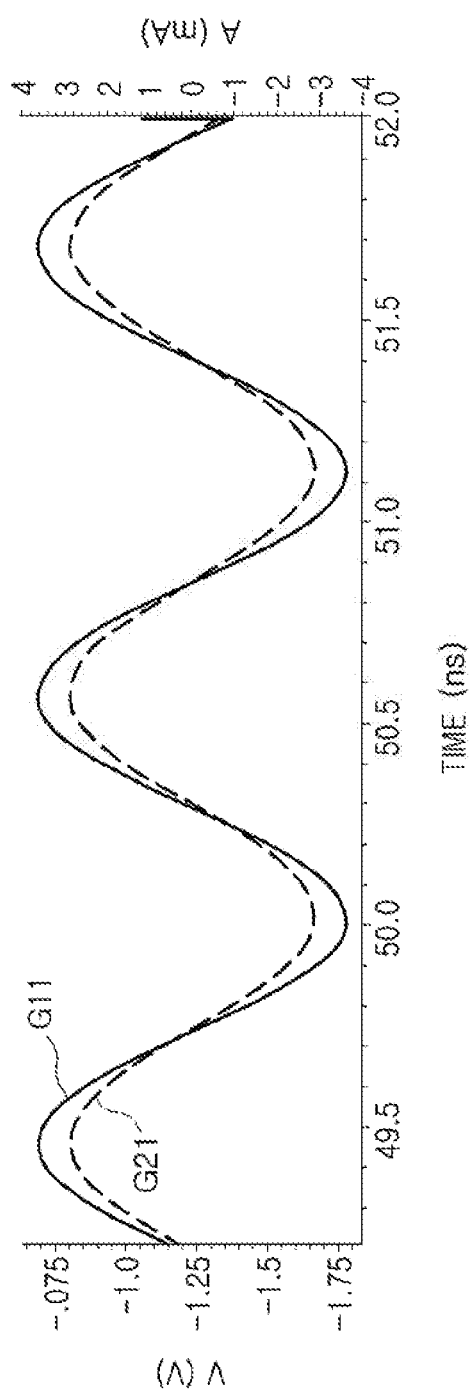
FIG. 13B is a graph of a level of leakage voltage (on an antenna side) in one channel in the off state in the antenna switch circuit, according to an embodiment.

FIG. 13A is a graph of a leakage voltage from a gate of a pass transistor in an off state in an antenna switch circuit according to an embodiment disclosed herein. FIG. 13B is a graph of a leakage voltage (on an ANT side) in one channel in the off state according to the embodiment disclosed herein.

As illustrated in FIG. 13A, G11 indicates a level of a leakage voltage from a gate of a pass transistor in an off state according to the related art, and G21 indicates a level of a leakage voltage from a gate of a pass transistor in an off state according to the embodiment disclosed herein. As illustrated in FIG. 13B, G11 indicates a level of a leakage voltage in one channel in an off state according to the related art, and G21 indicates a level of a leakage voltage in one channel in an off state according to the embodiment disclosed herein.

As illustrated in FIGS. 13A and 13B, referring to graphs G11 and G21, the level of the leakage voltage from the gate of the pass transistor in the off state in the antenna switch circuit and the level of the leakage voltage in the one channel in the off state according to the disclosed embodiment are also reduced.

Figure 14A:
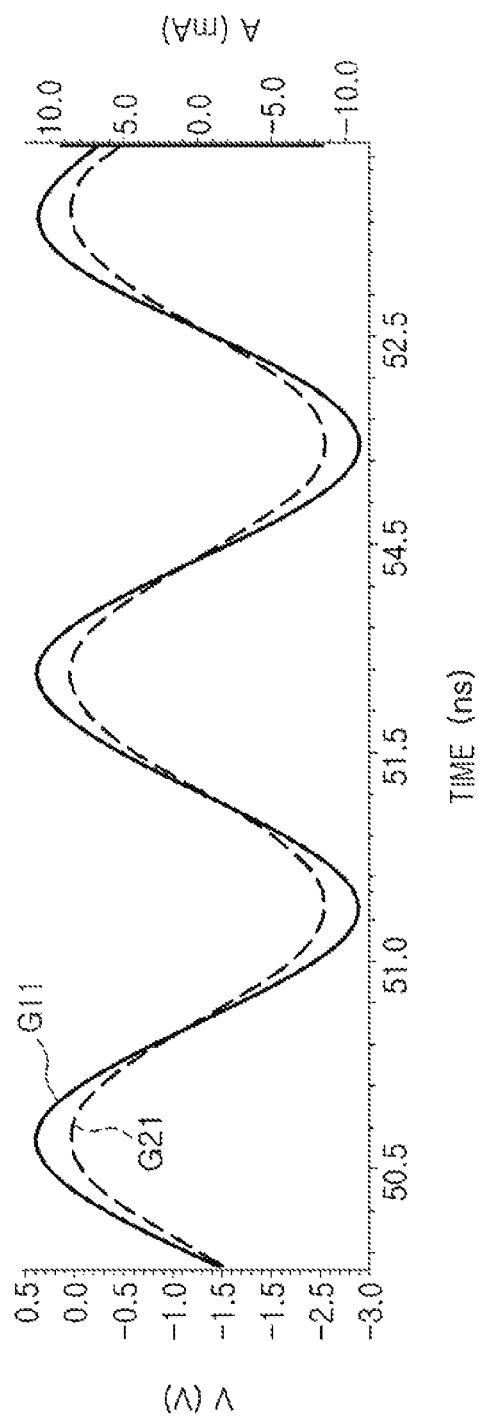
FIG. 14A is a graph of a level of a leakage voltage (on an ANT side) in an entire channel in an off state in an antenna switch circuit, according to an embodiment.

FIG. 14A is a graph of a leakage voltage (on an ANT side) in an entire channel in an off state in an antenna switch circuit according to an embodiment disclosed herein. FIG. 14B is a graph of a leakage voltage from a gate of a pass transistor in an on state in the antenna switch circuit according to an embodiment disclosed herein.

As illustrated in FIG. 14A, G11 indicates a level of a leakage voltage (on an ANT side) in an entire channel in an off state according to the related art, and G21 indicates a level of a leakage voltage (on the ANT side) in an entire channel in an off state in an antenna switch circuit according to the embodiment disclosed herein.

As illustrated in FIG. 14B, G11 indicates a level of a leakage voltage from a gate of a pass transistor in an on state according to the related art, and G21 indicates a level of a leakage voltage from a gate of a pass transistor in an on state in the antenna switch circuit according to the embodiment disclosed herein.

As illustrated in FIGS. 14A and 14B, referring to graphs G11 and G21, both the level of the leakage voltage (on the ANT side) in the entire channel in the off state and the level of the leakage voltage from the gate of the pass transistor in the on state in the antenna switch circuit according to the disclosed embodiment (Refer to G21) are lower than the level of the leakage voltage according to the related art (Refer to G11).

Figure 15:
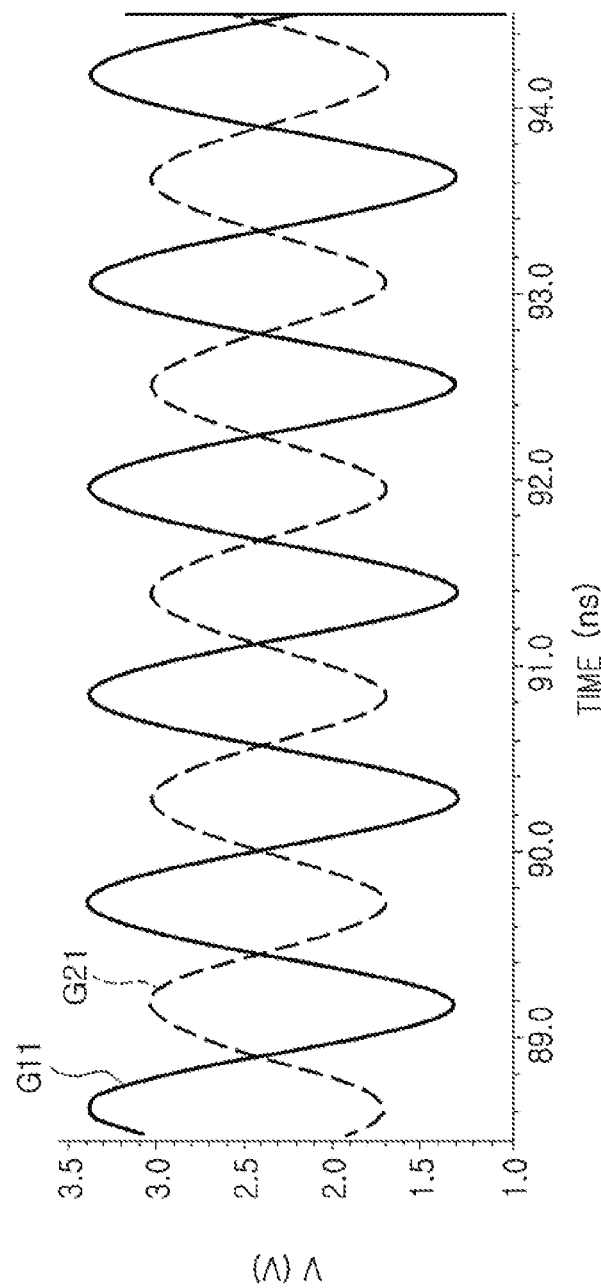
FIG. 15 is a graph of a level of a voltage across opposite ends of a first variable capacitor element, for example, a varactor diode, according to an embodiment.

FIG. 15 is a graph of a voltage across opposite ends of the first variable capacitor element CB11/CB21, for example, a varactor diode, according to an embodiment.

G11 and G21 of FIG. 15 indicate magnitudes of voltages across the opposite ends of the first variable capacitor element CB11 when input signals are different in power; an input signal is of relatively high power in graph G11; and an input signal is of relatively low power in graph G21.

Referring to graphs G11 and G21 of FIG. 15, the voltage across the opposite ends of the first variable capacitor element CB11 according to the disclosed embodiment is a voltage determined by a body voltage and the strength of a voltage of an alternating current (AC) input signal input by the first voltage dividing circuit 110 of FIG. 1, and changes according to a power level of the input signal.

Figure 16:
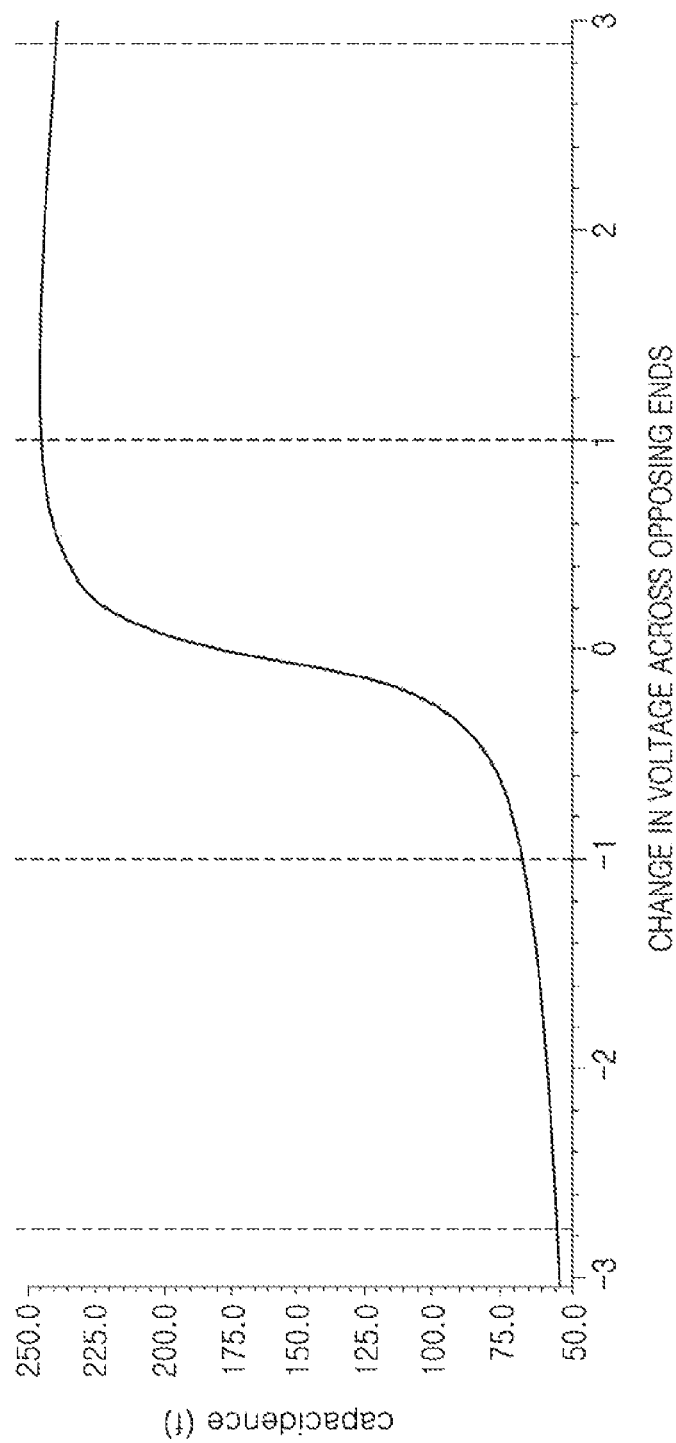
FIG. 16 is a graph of a level of a variable capacitance according to a voltage across opposite ends of a first variable capacitor element, for example, a varactor diode, according to an embodiment.

FIG. 16 is a graph of variable capacitance according to a voltage across opposite ends of the first variable capacitor element CB11, for example, a varactor diode, according to an embodiment.

FIG. 16 depicts a change in capacitance when a voltage difference between the opposite ends changes from negative to positive. Referring to FIG. 16, the voltage across the opposite ends of the first variable capacitor element CB11 becomes a forward voltage or a reverse voltage according to a body voltage.

As set forth above, according to the embodiments disclosed herein, harmonic characteristics for high performance may be implemented without increasing an antenna switch circuit size, and thus, in a design of a chip, space may be saved and costs may be reduced.

Further, price competitiveness may be relatively improved by controlling the use of an additional filter, such as a notch filter, for removing harmonics in a module of the antenna switch circuit.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna switch circuit, comprising:
   a first switch circuit connected between a first signal port for signal transmission and reception and an antenna port, and configured to be operated by a first gate signal; and
   a second switch circuit connected between a second signal port for signal transmission and reception and the antenna port, and configured to be operated by a second gate signal,
   wherein either one or both of the first switch circuit and the second switch circuit comprises
      a first transistor and a second transistor connected in series between the first and second signal ports,
      a first voltage dividing circuit comprising a first resistor and a second resistor connected in series between a source of the first transistor and a drain of the first transistor, and
      a first variable capacitor circuit connected between the first voltage dividing circuit and a body of the first transistor, and comprising capacitance varying according to a voltage across opposite ends of the first variable capacitor circuit.

2. The antenna switch circuit of claim 1, wherein the either one or both of the first switch circuit and the second switch circuit further comprises
   a second voltage dividing circuit comprising a third resistor and a fourth resistor connected in series between a source of the second transistor and a drain of the second transistor, and
   a second variable capacitor circuit connected between the second voltage dividing circuit and a body of the second transistor, and comprising capacitance varying according to a voltage across opposite ends of the second variable capacitor circuit.

3. The antenna switch circuit of claim 2, wherein
   the first variable capacitor circuit comprises a first variable capacitor connected between a first connection node, located between the first resistor and the second resistor, and a body node of the first transistor, and
   the first variable capacitor comprises capacitance varying according to a magnitude of a voltage between the first connection node and the body node of the first transistor.

4. The antenna switch circuit of claim 3, wherein the first variable capacitor comprises a varactor diode.

5. The antenna switch circuit of claim 2, wherein
   the first variable capacitor circuit comprises
      a first variable capacitor connected between a first connection node, located between the first resistor and the second resistor, and a body node of the first transistor, and
      a second variable capacitor connected between an end of the second resistor, opposite the first connection node, and the body node of the first transistor,
   the first variable capacitor comprises capacitance varying according to a magnitude of a voltage between the first connection node and the body node of the first transistor, and the second variable capacitor comprises capacitance varying according to a magnitude of a voltage between the end of the second resistor and the body node of the first transistor.

6. The antenna switch circuit of claim 2, wherein
the second variable capacitor circuit comprises a first variable capacitor connected between a third connection node, located between the third resistor and the fourth resistor, and a body node of the second transistor, and
the first variable capacitor comprises capacitance varying according to a magnitude of a voltage between the third connection node and the body node of the second transistor.

7. The antenna switch circuit of claim 2, wherein
the second variable capacitor circuit comprises
   a first variable capacitor connected between a third connection node, located between the third resistor and the fourth resistor, and a body node of the second transistor, and
   a second variable capacitor connected between an end of the fourth resistor, opposite the third connection node, and the body node of the second transistor,
the first variable capacitor comprises capacitance varying according to a magnitude of a voltage between the third connection node and the body node of the second transistor, and
the second variable capacitor comprises capacitance varying according to a magnitude of a voltage between the end of the fourth resistor and the body node of the second transistor.

8. The antenna switch circuit of claim 2, wherein
the second resistor is connected to a connection node of the first and second transistors, and comprises a resistance value that is less than a resistance value of the first resistor, and
the third resistor is connected to the connection node of the first and second transistors, and comprises a resistance value that is less than a resistance value of the fourth resistor.

9. The antenna switch circuit of claim 2, wherein
the second resistor is connected to a connection node of the first and second transistors, and comprises a resistance value that is greater than a resistance value of the first resistor, and
the third resistor is connected to the connection node of the first and second transistors, and comprises a resistance value that is greater than a resistance value of the fourth resistor.

10. An antenna switch circuit, comprising:
a first switch circuit connected between a first signal port for signal transmission and reception and an antenna port, and configured to be operated by a first gate signal;
a second switch circuit connected between a second signal port for signal transmission and reception and the antenna port, and configured to be operated by a second gate signal;
a first shunt circuit connected in series between the first signal port and a first ground port, and configured to be switched by a third gate signal together with the first switch circuit; and
a second shunt circuit connected in series between the second signal port and a second ground port, and configured to be switched by a fourth gate signal together with the second switch circuit, wherein any one or any combination of any two or more of the first switch circuit, the second switch circuit, the first shunt circuit, and the second shunt circuit comprises
   a first transistor and a second transistor connected in series between the first and second signal ports,
   a first voltage dividing circuit comprising a first resistor and a second resistor connected in series between a source of the first transistor and a drain of the first transistor, and
   a first variable capacitor circuit connected between the first voltage dividing circuit and a body of the first transistor, and comprising capacitance varying according to a voltage across opposite ends of the first variable capacitor circuit.

11. The antenna switch circuit of claim 10, wherein the any one or any combination of any two or more of the first switch circuit, the second switch circuit, the first shunt circuit, and the second shunt circuit comprises
   a second voltage dividing circuit comprising a third resistor and a fourth resistor connected in series between a source of the second transistor and a drain of the second transistor, and
   a second variable capacitor circuit connected between the second voltage dividing circuit and a body of the second transistor, and comprising capacitance varying according to a voltage across opposite ends of the second variable capacitor circuit.

12. The antenna switch circuit of claim 11, wherein
the first variable capacitor circuit comprises a first variable capacitor connected between a first connection node, located between the first resistor and the second resistor, and a body node of the first transistor, and
the first variable capacitor comprises capacitance varying according to a magnitude of a voltage between the first connection node and the body node of the first transistor.

13. The antenna switch circuit of claim 12, wherein the first variable capacitor comprises a varactor diode.

14. The antenna switch circuit of claim 11, wherein
the first variable capacitor circuit comprises
   a first variable capacitor connected between a first connection node, located between the first resistor and the second resistor, and a body node of the first transistor, and
   a second variable capacitor connected between an end of the second resistor, opposite the first connection node, and the body node of the first transistor,
the first variable capacitor comprises capacitance varying according to a magnitude of a voltage between the first connection node and the body node of the first transistor, and
the second variable capacitor comprises capacitance varying according to a magnitude of a voltage between the end of the second resistor and the body node of the first transistor.

15. The antenna switch circuit of claim 11, wherein
the second variable capacitor circuit comprises a first variable capacitor connected between a third connection node, located between the third resistor and the fourth resistor, and a body node of the second transistor, and
the first variable capacitor comprises capacitance varying according to a magnitude of a voltage between the third connection node and the body node of the second transistor.

16. The antenna switch circuit of claim 11, wherein
the second variable capacitor circuit comprises
- a first variable capacitor connected between a third connection node, located between the third resistor and the fourth resistor, and a body node of the second transistor, and
- a second variable capacitor connected between an end of the fourth resistor, opposite the third connection node, and the body node of the second transistor, the first variable capacitor comprises capacitance varying according to a magnitude of a voltage between the third connection node and the body node of the second transistor, and the second variable capacitor comprises capacitance varying according to a magnitude of a voltage between the end of the fourth resistor and the body node of the second transistor.

17. The antenna switch circuit of claim 11, wherein
the second resistor is connected to a connection node of the first and second transistors, and comprises a resistance value that is less than a resistance value of the first resistor, and the third resistor is connected to the connection node of the first and second transistors, and comprises a resistance value that is less than a resistance value of the fourth resistor.

18. The antenna switch circuit of claim 11, wherein
the second resistor is connected to a connection node of the first and second transistors, and comprises a resistance value that is greater than a resistance value of the first resistor, and the third resistor is connected to the connection node of the first and second transistors, and comprises a resistance value that is greater than a resistance value of the fourth resistor.

* * * * *